(12) United States Patent
Dai et al.

(10) Patent No.: US 6,730,937 B2
(45) Date of Patent: May 4, 2004

(54) HIGH RESOLUTION AND BRIGHTNESS FULL-COLOR LED DISPLAY MANUFACTURED USING CMP TECHNIQUE

(75) Inventors: Yuan-Tung Dai, Chungli (TW); Yuan-Ching Peng, Hsinchu (TW); Chien-Chih Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 575 days.

(21) Appl. No.: 09/748,834

(22) Filed: Dec. 26, 2000

(65) Prior Publication Data

US 2002/0079834 A1 Jun. 27, 2002

(51) Int. Cl.⁷ .............................................. H01L 33/00
(52) U.S. Cl. .............................. 257/89; 257/88; 257/90; 257/196; 438/28; 438/29; 438/34; 438/35
(58) Field of Search ............................. 257/88, 89, 90, 257/196; 438/29, 34, 35, 38, 46, 47, 28

(56) References Cited

U.S. PATENT DOCUMENTS

| | | | | |
|---|---|---|---|---|
| 5,604,761 A | * | 2/1997 | Seki et al. | 372/43 |
| 5,795,798 A | * | 8/1998 | Mishra et al. | 438/35 |
| 6,057,561 A | * | 5/2000 | Kawasaki et al. | 257/94 |
| 6,541,130 B2 | * | 4/2003 | Fukuda et al. | 428/690 |

* cited by examiner

*Primary Examiner*—Nathan J. Flynn
*Assistant Examiner*—Remmon R. Fordé

(57) ABSTRACT

A full-color LED display includes red, green and blue LED elements. A first substrate is used to form red and green LED elements which are then covered by a first passivation layer. A second substrate is bonded to the passviation layer and polished as a thin substrate layer. A blue LED element is fabricated on the thin substrate layer. The three LED elements are then covered by a second passivation layer to construct a full-color LED device. A full-color, high resolution and high brightness LED display is formed by a plurality of full-color LED devices arranged in rows and columns in a matrix form.

12 Claims, 8 Drawing Sheets

HIGH RESOLUTION AND BRIGHTNESS FULL-COLOR LED DISPLAY MANUFACTURED USING CMP TECHNIQUE

FIELD OF THE INVENTION

The present invention generally relates to a display device, and more specifically to a light emitting diode (LED) display having high resolution and brightness and the method of manufacturing the same.

BACKGROUND OF THE INVENTION

The recent advance in computers, personal communication devices and various information appliances has brought a new industrial revolution into human history. These electronic devices have changed and transformed human life significantly. Almost every one of these devices requires a display to show input and output information. Many researchers and manufactures are striving to develop or invent new display devices with high resolution, rich colors, wide viewing angles and high brightness along with small volumes and light weight.

Conventionally, cathode ray tubes (CRT) are the most popular display devices widely used in a television or a computer. Although a CRT has many advantages as a display device, its bulky size and heavy weight have made it very inconvenient or even impossible to be a part of a compact and portable electronic device. In recent years, flat panel liquid crystal display devices have been used widely in a notebook or a personal communication device. Other flat panel display devices such as plasma displays and field emission displays are also being developed and finding their market places.

LEDs represent another type of device that has a great potential to be used as a light weight and high quality display devices. However, because many difficulties in full-color LED display technology remain to be overcome, LED devices generally are used only as traffic or vehicle lamps for illumination. Some advertisement or bulletin board also uses LEDs as a display device for showing simple messages.

In the state of the art semiconductor technology, an LED device typically is fabricated with an active layer between upper and lower cladding layers on top of a semiconductor substrate. The composition of semiconductor materials chosen in these layers determines the color of the LED device. LED layers of different materials for different colors can only be grown or deposited on appropriate substrates. Because a semiconductor substrate typically is appropriate for forming two LEDs emitting light having closer spectra, such as red and green LEDs or green and blue LEDs, the third LED has to be formed on a different substrate in order to fabricate a full-color LED device.

Consequently, although LEDs of red and green colors may be fabricated on a same substrate, fabricating a blue LED on the very same substrate has been difficult. LED displays of full-color is yet to be developed. If a full-color LED display can be successfully manufactured, it has many advantages such as wide viewing angle, small volume and light weight. Therefore, there is a strong need in developing a full-color, high resolution and brightness LED display.

SUMMARY OF THE INVENTION

This invention has been made to meet the need of a full-color, high resolution and brightness LED display. The primary object is to provide a new structure for a full-color LED device. It is also an object of the invention to provide a method of fabricating the full-color LED device. It is yet another object to provide a full-color LED display by means of a plurality of full-color LED devices. A full-color LED display requires the fabrication of red, green and blue LED elements in a semiconductor device structure. This invention uses wafer bonding and chemical-mechanical polishing technique to provide more than one substrate for forming LEDs of red, green and blue colors on a same display.

According to the invention, a first semiconductor substrate for manufacturing an LED element of a first color is first prepared. A first color LED element is fabricated on a buffer layer that covers the semiconductor substrate. In general, a second color LED element can also be fabricated on the same substrate adjacent to the first color LED element. A first passivation layer is then formed above the buffer layer and the two LED elements. A second semiconductor substrate is then bonded to the first passivation layer and polished as a thin substrate layer by chemical-mechanical polishing (CMP). An LED element of a third color is subsequently fabricated above the second substrate. A second passivation layer is deposited above the semiconductor device structure that comprises the three LED elements. Thus, a full-color LED device is fabricated.

The order of forming red, green and blue color LED elements is not critical in this invention. Dependent on the semiconductor substrates chosen, the second color LED element may be formed on the first or second substrate. In general, red and green LED elements may be formed on a same substrate, and green and blue LED elements may also be formed on a same substrate. However, it is difficult to form red and blue LED elements on a same substrate.

A full-color LED display can be manufactured by arranging a plurality of full-color LED devices in rows and columns in a matrix form. By providing proper metal lines and electrode layers along with peripheral circuits, each full-color LED device can be addressed and controlled to display a full-color image.

The foregoing and other objects, features, aspects and advantages of the present invention will become better understood from a careful reading of a detailed description provided herein below with appropriate reference to the accompanying drawings.

DETAILED DESCRIPTION OF THE INVENTION

Figure 1:
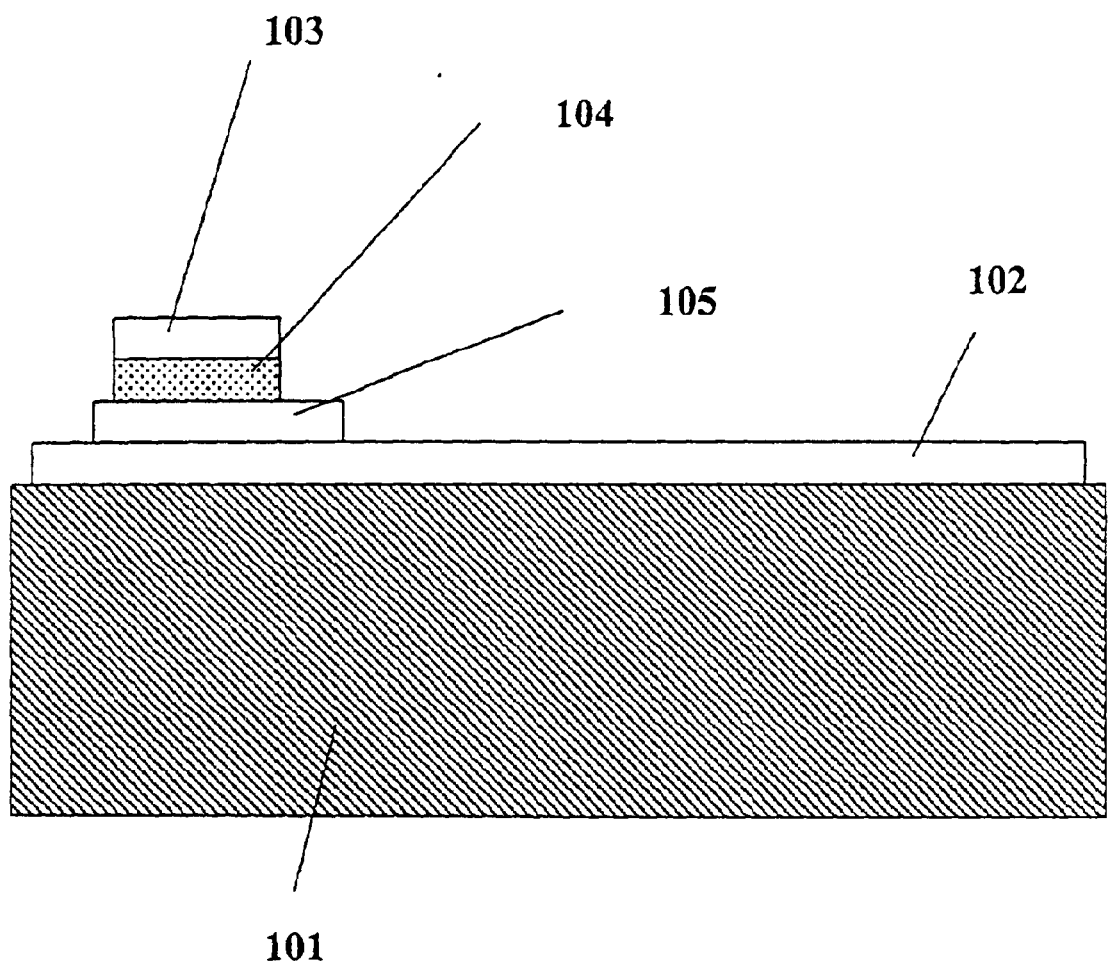
FIG. 1 shows a cross-sectional view of a semiconductor substrate having a red LED element fabricated thereon according to the invention.

This invention overcomes the difficulty of forming LEDs of different colors on a same substrate by covering an LED device of one color with a new substrate to form another LED device of a different color. With reference to FIG. 1, a cross-sectional view of a red LED element formed on a first substrate is shown.

As an example, FIG. 1 shows the formation of a red LED element on a semiconductor substrate 101 such as GaAs, GaP or InP. A buffer layer 102 is first formed above the first substrate. An LED structure is then fabricated on the buffer layer. The LED structure may be based on a double heterostrcuture having an active layer 104 between a p-type cladding layer 103 and an n-type cladding layer 105 as shown in FIG. 1. For forming the LED element, InP may be used as the material for the buffer layer.

Figure 2:
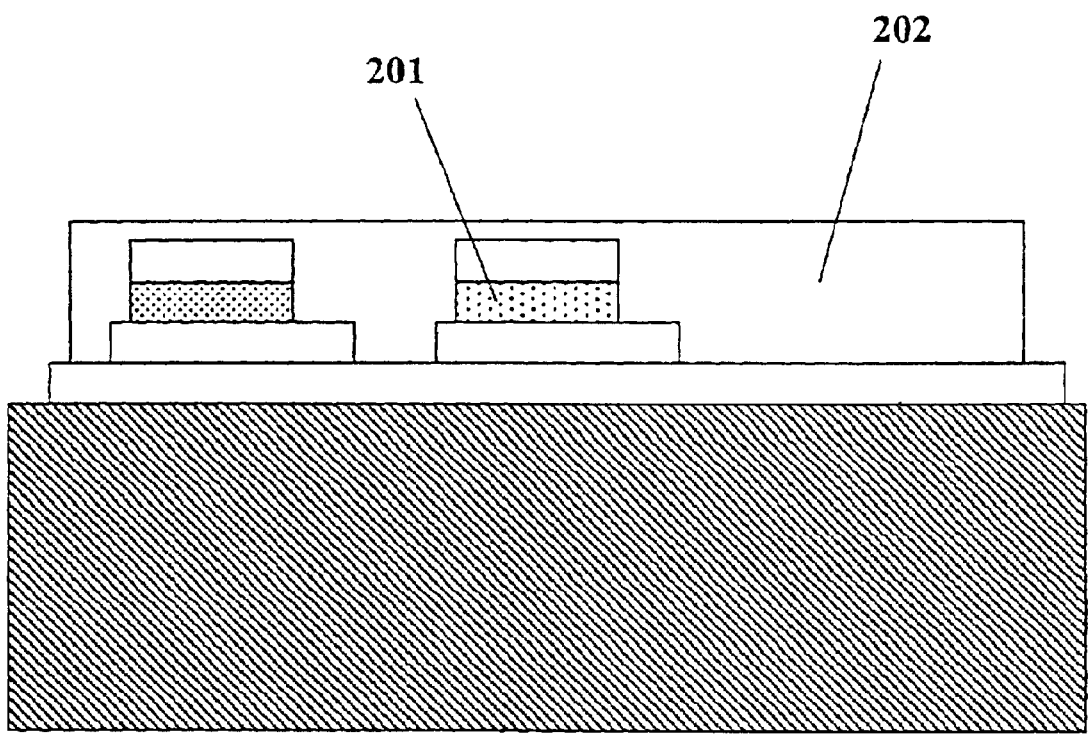
FIG. 2 shows a cross-sectional view of a semiconductor substrate having a passivation layer covering both red and green LED elements fabricated on a buffer layer above the substrate according to the invention.

Because the first semiconductor substrate in this example can also be used for manufacturing a green LED element, FIG. 2 shows that after the red LED element has been fabricated, a green LED element 201 is also fabricated next to the red LED element. The two LED elements on top of the first substrate are then covered with a first passivation layer 202. As shown in FIG. 2, the first passivation layer covers area above the two LED elements as well as the buffer layer. An example of the material used for the passivation layer is SiN.

Figure 3:
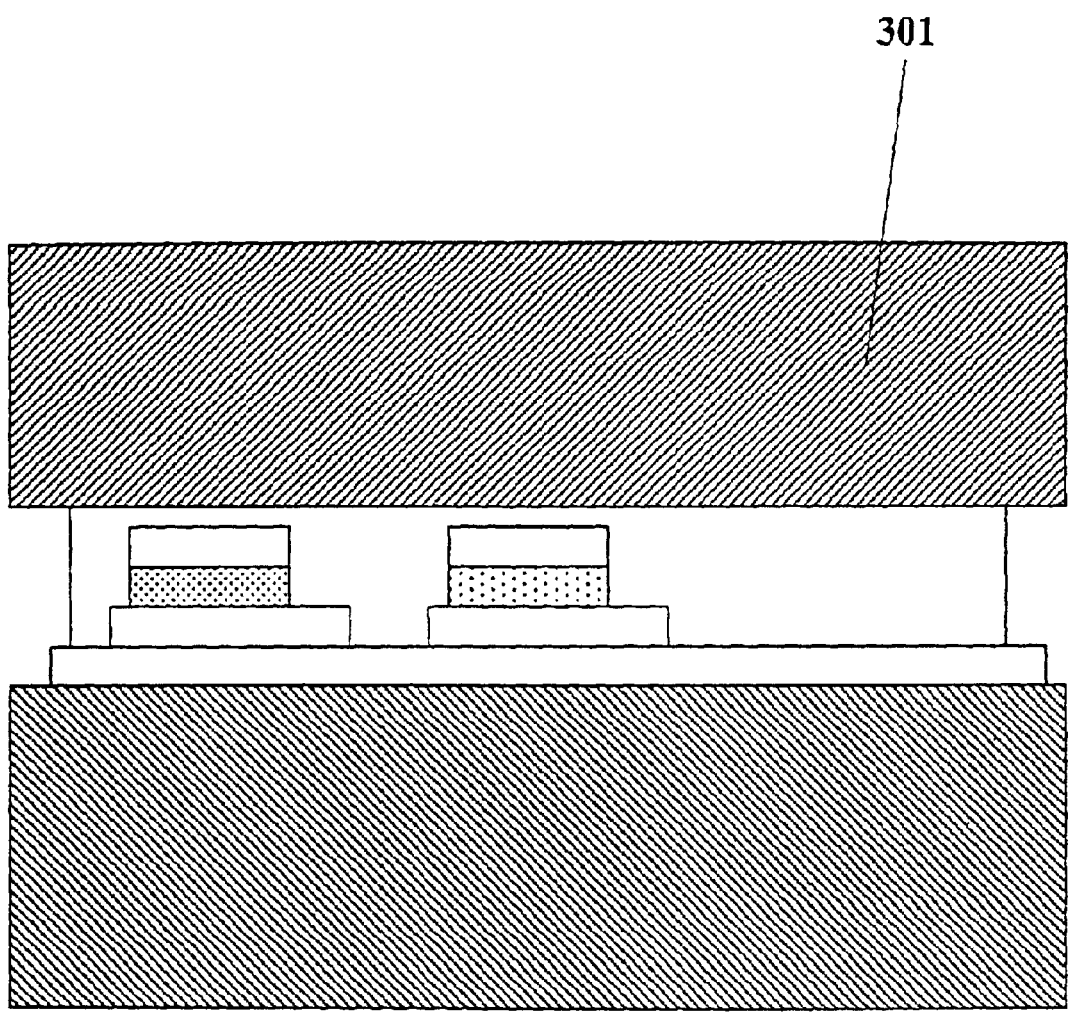
FIG. 3 shows a new substrate being bonded above the passivation layer of the semiconductor device structure according to the invention.

As described in the background of the invention, a blue LED device can not be manufactured on the same substrate that comprises GaAs. GaP or InP. A blue LED element requires a different semiconductor substrate to grow on. With reference to FIG. 3, a second semiconductor substrate layer 301 is formed above the first passivation layer. The preferred technique of forming the second semiconductor substrate is by wafer bonding. The second substrate may comprise sapphire or SiC that is suitable for growing a blue LED.

Figure 4:
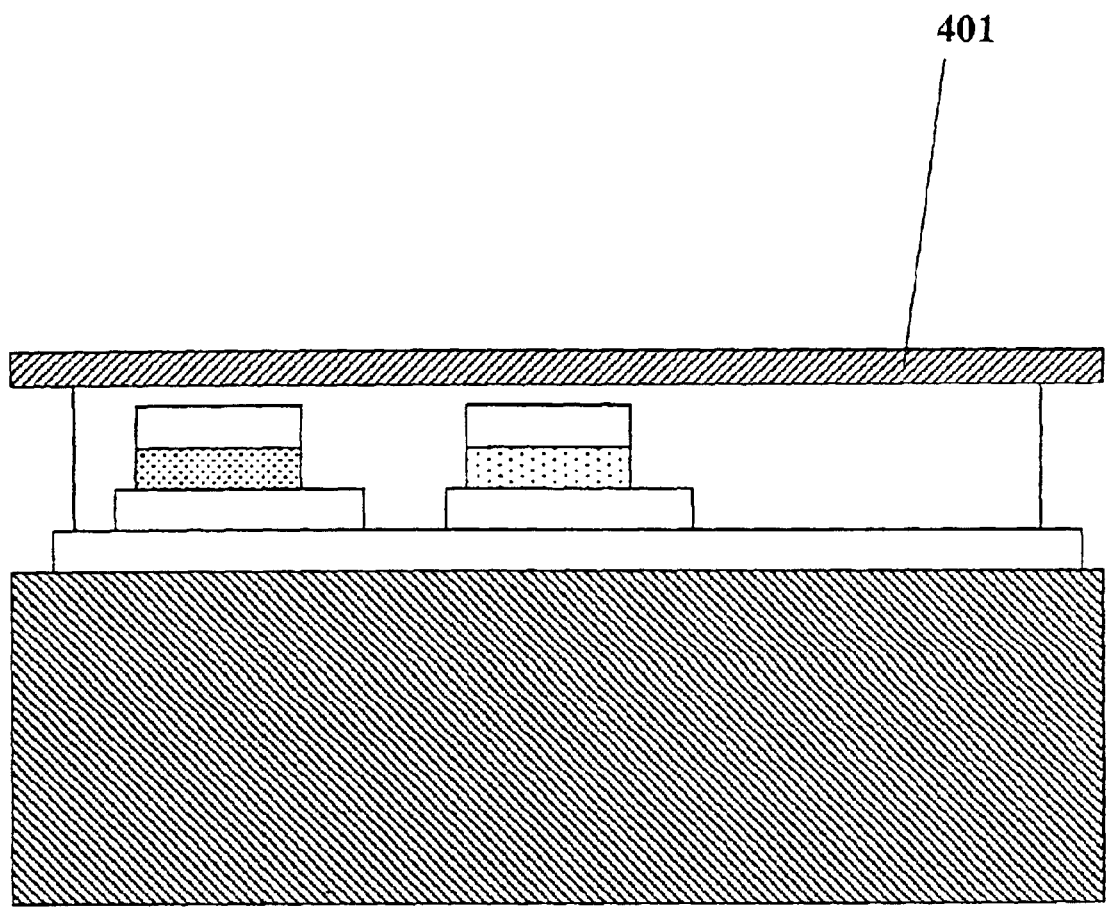
FIG. 4 shows that the new substrate as shown in FIG. 3 has been polished as a thin substrate layer by chemical-mechanical polishing.
Figure 5:
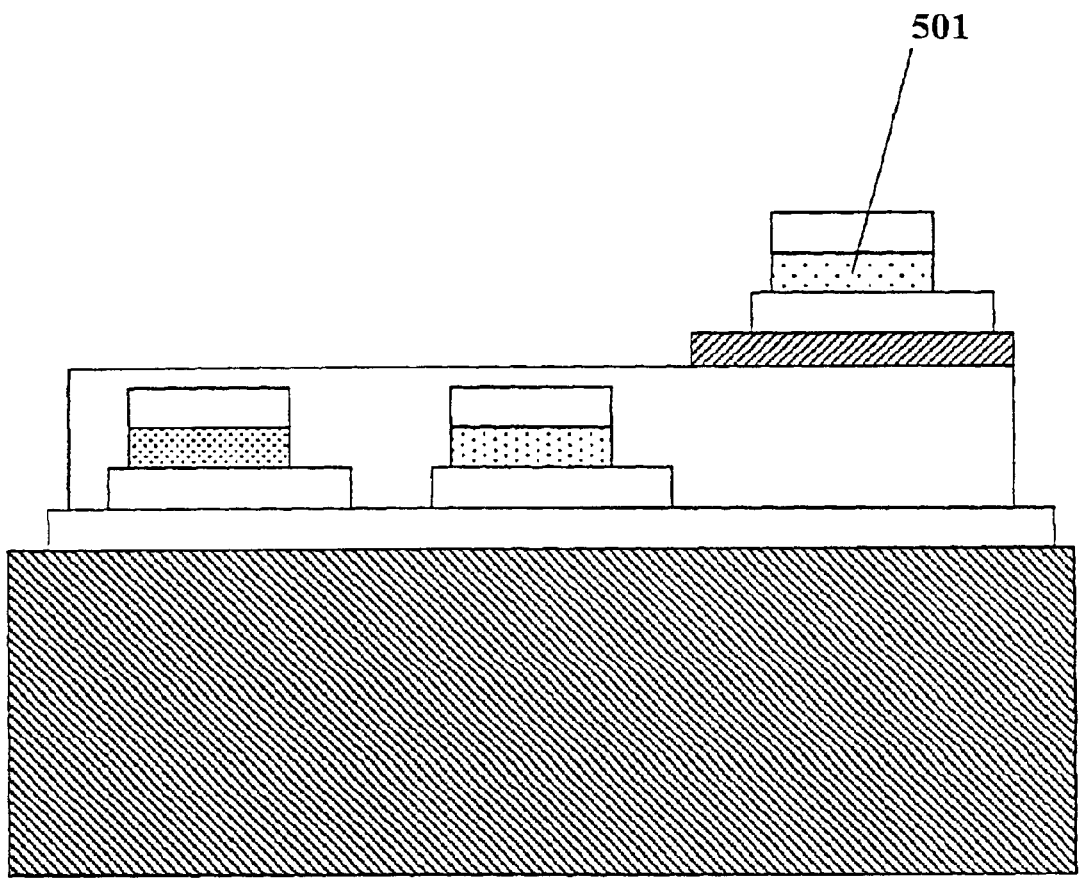
FIG. 5 shows a blue LED element fabricated on the new substrate and the area above the red and green LED elements no longer has the new substrate layer.
Figure 6:
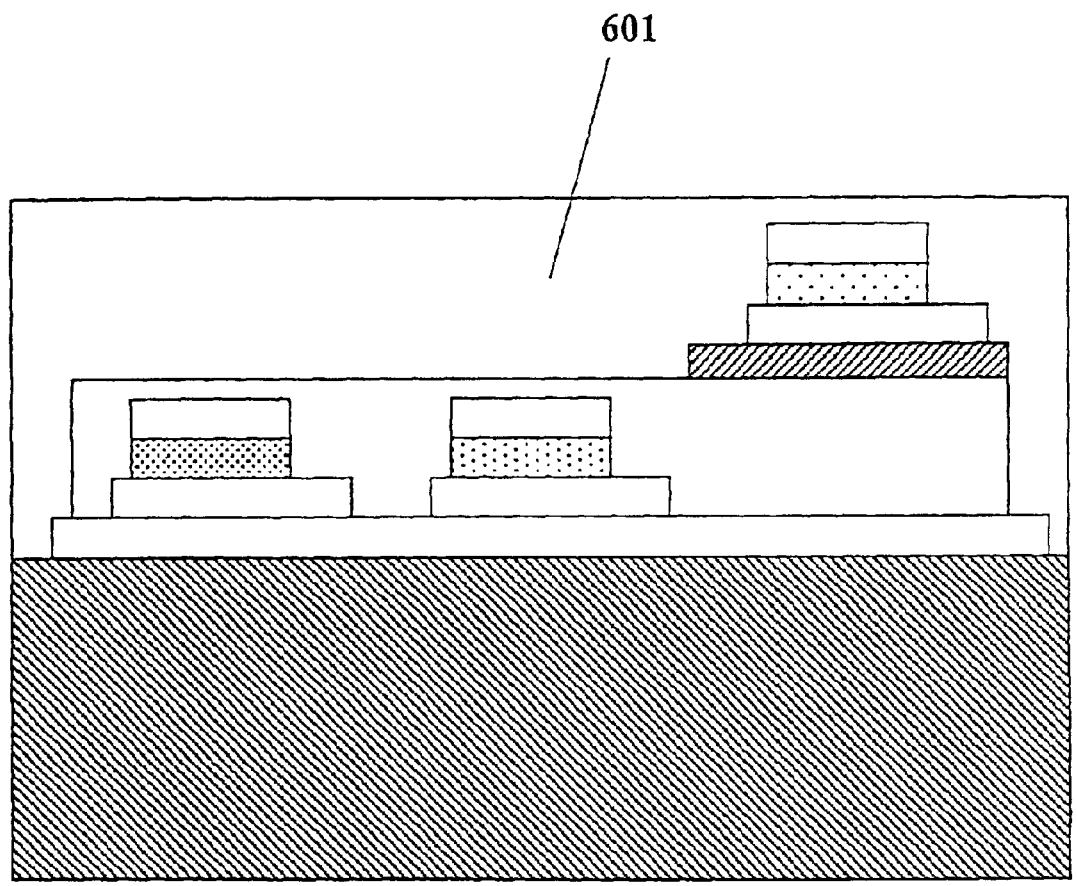
FIG. 6 shows a passivation layer covering the semiconductor device structure comprising red, green and blue LED elements according to the invention.

The second substrate is then polished into a thin substrate layer 401 as shown in FIG. 4 by using chemical-mechanical polishing technique. The preferred thickness of the thin substrate layer is less than 1 $\mu$m. A blue LED element 501 can then be formed by depositing film layers above the new substrate as shown in FIG. 5. It should be noted that the second substrate layer above the red and green LEDs is removed, leaving only the blue LED structure with the second substrate underneath. Finally, a second passivation layer 601 is used to cover the semiconductor structure including the first substrate, the buffer layer, the first passivation layer, the second substrate and the blue LED element. The cross-sectional view of the full-color LED device is shown in FIG. 6. The red, green and blue LED structures do not overlap one another. In practice, the second substrate layer above the red and green LEDs may or may not be removed.

Figure 7:
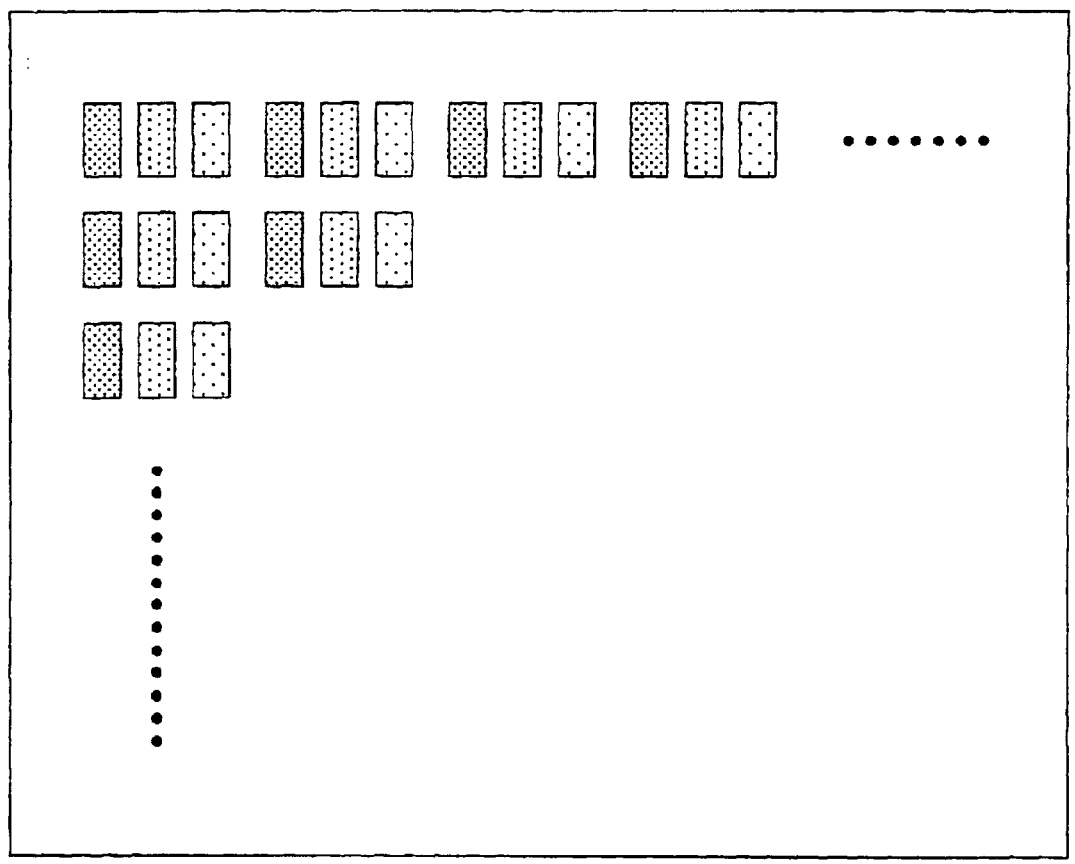
FIG. 7 shows a simplified top view of a full-color LED display comprising a plurality of full-color LED devices arranged in rows and columns in a matrix form.

In order to form a full-color display, a plurality of full-color LED devices can be arranged in a matrix form with appropriate metal and electrode lines as well as peripheral circuits for addressing and controlling each full-color LED device. Techniques similar to those used in an active or passive organic LED display can be applied to the peripheral circuits of this invention. Because each full-color LED device has its own red, green and blue LED elements whose intensities can be controlled, full-color images can be displayed by the full-color display that comprises a plurality of pixels each comprising a full-color LED device. FIG. 7 illustrates a simplified top view of the full-color LED display.

In the above description, red and green LED elements are fabricated on a substrate first as shown in FIG. 2. A new substrate is then bonded for the fabrication of a blue LED element. Because green and blue LED elements may be formed on a same semiconductor substrate such as sapphire or SiC, it is possible that the green and blue LED elements are formed on a substrate first and then a new GaAs substrate is bonded for fabricating the red LED element.

Figure 8:
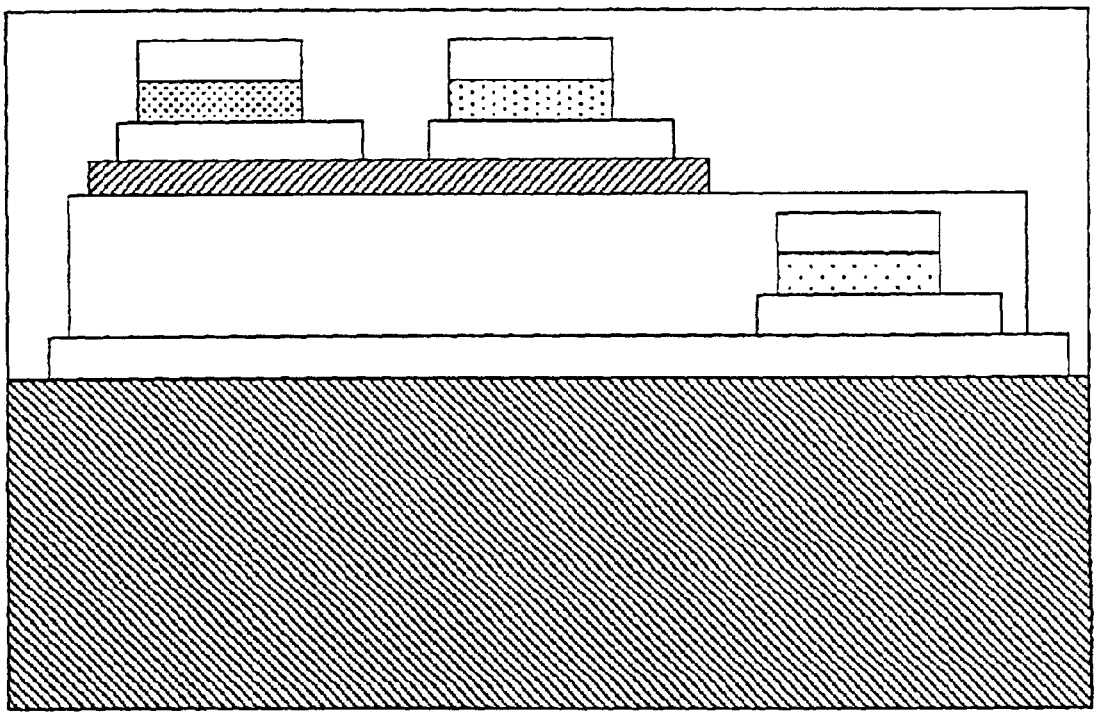
FIG. 8 shows another embodiment of this invention in which a blue LED element is formed on a first substrate and a second substrate is bonded for fabricating green and red LED elements.

In general, the order of forming red, green and blue LED elements can be changed. A first substrate may be used to form a blue LED element and then a new substrate is bonded for the fabrication of red and green LED elements as shown in FIG. 8. Similarly, a first substrate may be used to form a red LED element and then a new substrate is bonded for fabricating green and blue LED elements.

In practice, red and green LED elements can be fabricated on a same substrate. Green and blue LED elements can also be fabricated on a same substrate. However, it is difficult to fabricate both red and blue LED elements on a same substrate. It is also possible to form the three LED elements on three separate substrates that are bonded together based on the principle described above. Nevertheless, it may add more process steps and lose its economical value.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A full-color LED device, comprising:
    a first semiconductor substrate;
    a buffer layer covering said first semiconductor substrate;
    first and second color LED elements formed above said buffer layer;
    a first passivation layer covering said first and second color LED elements and said buffer layer;
    a second semiconductor substrate formed above said first passivation layer;
    a third color LED element fabricated above said second semiconductor substrate; and
    a second passivation layer covering said first semiconductor substrate, said buffer layer, said first passivation layer, said second semiconductor substrate and said third color LED element.

2. The full-color LED device as claimed in claim 1, wherein said second semiconductor substrate does not overlap said first and second LED elements.

3. The full-color LED device as claimed in claim 1, wherein said second semiconductor substrate has a thickness less than 1 $\mu$m.

4. The full-color LED device as claimed in claim 1, said first semiconductor substrate comprising GaAs, GaP or InP, and said first and second color LED elements being red and green LED elements.

5. The full-color LED device as claimed in claim 1, said first semiconductor substrate comprising sapphire or SiC, and said first and second color LED elements being blue and green LED elements.

6. A full-color LED display comprising a plurality of full-color LED devices as claimed in claim 1, said plurality of full-color LED devices being arranged in rows and columns.

7. A full-color LED device, comprising:
   a first semiconductor substrate;
   a buffer layer covering said first semiconductor substrate;
   a first color LED element formed above said buffer layer;
   a first passivation layer covering said first color LED element and said buffer layer;
   a second semiconductor substrate formed above said first passivation layer;
   second and third color LED elements fabricated above said second semiconductor substrate; and
   a second passivation layer covering said first semiconductor substrate, said buffer layer, said first passivation layer, said second semiconductor substrate and said second and third color LED elements.

8. The full-color LED device as claimed in claim 7, wherein said second semiconductor substrate does not overlap said first color LED element.

9. The full-color LED device as claimed in claim 7, wherein said second semiconductor substrate has a thickness less than 1 $\mu$m.

10. The full-color LED device as claimed in claim 7, said first semiconductor substrate comprising GaAs, GaP or InP, and said first color LED element being a red LED element.

11. The full-color LED device as claimed in claim 7, said first semiconductor substrate comprising sapphire or SiC, and said first color LED element being a blue LED element.

12. A full-color LED display comprising a plurality of full-color LED devices as claimed in claim 7, said plurality of full-color LED devices being arranged in rows and columns.

* * * * *